(12) United States Patent
Totsuka

(10) Patent No.: US 9,035,424 B2
(45) Date of Patent: May 19, 2015

(54) SEMICONDUCTOR DEVICE

(71) Applicant: Mitsubishi Electric Corporation, Tokyo (JP)

(72) Inventor: Masahiro Totsuka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/036,122

(22) Filed: Sep. 25, 2013

(65) Prior Publication Data

US 2014/0217548 A1 Aug. 7, 2014

(30) Foreign Application Priority Data

Feb. 5, 2013 (JP) ................... 2013-020558

(51) Int. Cl.
*H01L 29/76* (2006.01)
*H01L 49/02* (2006.01)
*H01L 27/01* (2006.01)

(52) U.S. Cl.
CPC .............. *H01L 28/60* (2013.01); *H01L 27/016* (2013.01)

(58) Field of Classification Search
USPC .................................. 257/534, 535, E29.343
See application file for complete search history.

(56) References Cited

U.S. PATENT DOCUMENTS

| | | | | |
|---|---|---|---|---|
| 5,812,364 | A | * 9/1998 | Oku et al. | 257/306 |
| 7,314,783 | B2 | 1/2008 | Lee et al. | |
| 7,821,051 | B2 | * 10/2010 | Yang et al. | 257/301 |
| 8,039,924 | B2 | * 10/2011 | Furumiya et al. | 257/535 |
| 2003/0197215 | A1 | 10/2003 | Coolbaugh et al. | |
| 2007/0216027 | A1 | 9/2007 | Okamura | |

FOREIGN PATENT DOCUMENTS

| | | |
|---|---|---|
| JP | 11-274428 A | 10/1999 |
| JP | 2007-250760 A | 9/2007 |
| JP | 2011-55015 A | 3/2011 |
| KR | 10-2004-0017637 A | 2/2004 |

OTHER PUBLICATIONS

Korean Patent Office; Office Action in Korean Patent Application No. 10-2014-0011999 (Feb. 22, 2915).

* cited by examiner

*Primary Examiner* — Chandra Chaudhari
(74) *Attorney, Agent, or Firm* — Leydig, Voit & Mayer, Ltd.

(57) ABSTRACT

A semiconductor device includes a substrate, a metal film on a portion of the substrate, a first dielectric film having a first portion on the metal film and a second portion on the substrate, the second portion being integral with the first portion, a lower electrode on the first portion, a second dielectric film having a first portion on the lower electrode and a second portion on the first dielectric film, the second portion of the second dielectric film being integral with the first portion of said second dielectric film, an upper electrode on a portion of the second dielectric film, and a reinforcing film disposed on the second dielectric film and in contact with a side of the upper electrode.

8 Claims, 5 Drawing Sheets

SEMICONDUCTOR DEVICE

BACKGROUND OF THE INVENTION

1. Field of the Invention

The present invention relates to a semiconductor device having a plurality of MIM capacitors and a method of manufacturing the semiconductor device.

2. Background Art

Japanese Laid-Open Patent Publication No. 2007-250760 discloses a semiconductor device having an MIM capacitor wherein the MIM capacitor is formed of a top wiring layer, a capacitance layer, and a flip-chip pad (F/CPAD).

In order to reduce the size of a semiconductor device having a plurality of MIM capacitors, the semiconductor device is preferably configured in such a manner that some of the MIM capacitors are formed on wiring layers or other MIM capacitors. (Such overlying MIM capacitors are referred to as "upper MIM capacitors.") The upper electrode of each upper MIM capacitor is preferably formed to have a relatively small width in order to ensure insulation of the upper MIM capacitor from adjacent device structures of the semiconductor device.

However, a reduction in the width of the upper electrode of the upper MIM capacitor results in a reduction in adhesion between the upper electrode and the underlying dielectric film, causing the upper electrode to detach or peel from the dielectric film.

The width of the upper electrode of the upper MIM capacitor may be increased to prevent the upper electrode from detaching or peeling from the underlying dielectric film. However, the dielectric film of the upper MIM capacitor typically has steps associated with the thickness of the wiring layer or MIM capacitor underlying the upper MIM capacitor. This means that in order to increase the width of the upper electrode of the upper MIM capacitor, it is necessary to form the electrode over those steps of the dielectric film. In that case, however, the upper electrode may detach or peel from the steps.

SUMMARY OF THE INVENTION

The present invention has been made to solve the above problems. It is, therefore, an object of the present invention to provide a semiconductor device having upper MIM capacitors formed on wiring layers or other MIM capacitors thereof wherein the upper electrode of each upper MIM capacitor is prevented from detaching or peeling from the dielectric film of the upper MIM capacitor. Another object of the invention is to provide a method of manufacturing such a semiconductor device.

According to one aspect of the present invention, a semiconductor device includes a substrate, a metal film formed on a portion of the substrate, a first dielectric film having a first portion on the metal film and a second portion on the substrate, the second portion being integrally formed with the first portion, a lower electrode formed on the first portion, a second dielectric film having a third portion on the lower electrode and a fourth portion on the first dielectric film, the fourth portion being integrally formed with the third portion, an upper electrode formed on a portion of the second dielectric film, and a reinforcing film disposed on the second dielectric film and in contact with a side of the upper electrode.

According to another aspect of the present invention, a method of manufacturing a semiconductor device, includes the steps of forming a metal film on a portion of a principal surface of a substrate, forming a first dielectric film having a first portion on the metal film and a second portion on the substrate, the second portion being integrally formed with the first portion, forming a lower electrode on the first portion, forming a second dielectric film having a third portion on the lower electrode and a fourth portion on the first dielectric film by coating in such a manner that the second dielectric film continuously covers the lower electrode and the first dielectric film, and that top surfaces of the third and fourth portions are flat and level with each other, forming a reinforcing film on the second dielectric film by CVD, sputtering, or vapor deposition, the reinforcing film having an opening directly above the lower electrode, and forming an upper electrode filling the opening.

Other and further objects, features and advantages of the invention will appear more fully from the following description.

DETAILED DESCRIPTION OF THE PREFERRED EMBODIMENTS

Semiconductor devices and methods of manufacturing a semiconductor device in accordance with embodiments of the present invention will be described with reference to the accompanying drawings. Throughout the specification the same or corresponding components are designated by the same reference symbols and may be described only once.

First Embodiment

Figure 1:
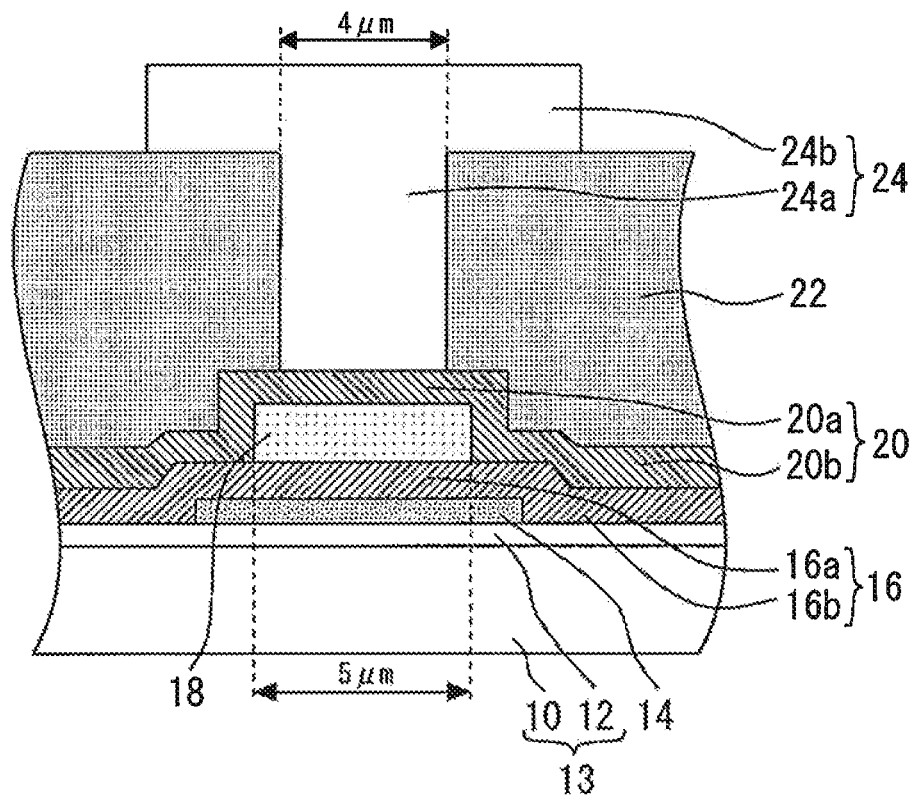
FIG. 1 is a cross-sectional view of a portion of a semiconductor device in accordance with a first embodiment.

FIG. 1 is a cross-sectional view of a portion of a semiconductor device in accordance with a first embodiment of the present invention. This semiconductor device includes a semiconductor substrate 10. The semiconductor substrate 10 is formed of, e.g., Si, GaAs, InP, GaN, or SiC. An insulating film 12 is formed on the semiconductor substrate 10. The semiconductor substrate 10 and the insulating film 12 are hereinafter referred to collectively as the substrate 13.

A metal film 14 is formed on a portion of the surface of the substrate 13. A first dielectric film 16 continuously covers the exposed portions of the substrate 13 and the metal film 14. The first dielectric film 16 has a first portion 16a on the metal film 14 and a second portion 16b on the substrate 13, with the second portion 16b being integrally formed with the first portion 16a. The first portion 16a is located at a higher level than the second portion 16b.

A lower electrode 18 is formed on the first portion 16a. The lower electrode 18 has a width of, e.g., 5 μm. A second dielectric film 20 is formed on the lower electrode 18 and the first dielectric film 16. The second dielectric film 20 has a third portion 20a on the lower electrode 18 and a fourth portion 20b on the first dielectric film 16, with the fourth portion 20b being integrally formed with the third portion 20a. The third portion 20a is located at a higher level than the fourth portion 20b. That is, steps are formed at the junction between the third portion 20a and the fourth portion 20b, as viewed in cross-section.

A reinforcing film 22 continuously covers the third portion 20a and the fourth portion 20b. The reinforcing film 22 has an opening having a width of approximately 4 μm directly above the lower electrode 18. The reinforcing film 22 is formed of, e.g., an organic resin, such as benzocyclobutene (BCB) or polyimide, fluoro resin, poly arylene ether (PAE), hydrogen silsequioxane (HSQ), or methyl silsequioxane (MSQ).

An upper electrode 24 is formed on the third portion 20a so as to fill the opening of the reinforcing film 22. The upper electrode 24 has a root portion 24a filling the opening of the reinforcing film 22, and a flange portion 24b formed on the reinforcing film 22. The root portion 24a and the flange portion 24b are integrally formed with each other. The sides of the root portion 24a of the upper electrode 24 are in contact with the reinforcing film 22.

The metal film 14, the first dielectric film 16, and the lower electrode 18 form a lower metal-insulator-metal (MIM) capacitor, while the lower electrode 18, the second dielectric film 20, and the upper electrode 24 form an upper MIM capacitor. It should be noted that the semiconductor device of the first embodiment is a microwave monolithic IC (MMIC) which includes a number of structures, called multilayer MIM capacitors, each formed by lower and upper MIM capacitors.

A method of manufacturing a semiconductor device in accordance with the first embodiment will now be described. First, a metal film 14, a first dielectric film 16, a lower electrode 18, and a second dielectric film 20 are formed by known techniques. Specifically, first, the metal film 14 is formed on a portion of the principal surface of a substrate 13. The first dielectric film 16 is then formed, which has a first portion 16a on the metal film 14 and a second portion 16b on the substrate 13, with the second portion 16b being integrally formed with the first portion 16a. The lower electrode 18 is then formed on the first portion 16a. The second dielectric film 20, which has a third portion 20a and a fourth portion 20b, is then formed.

Figure 2:
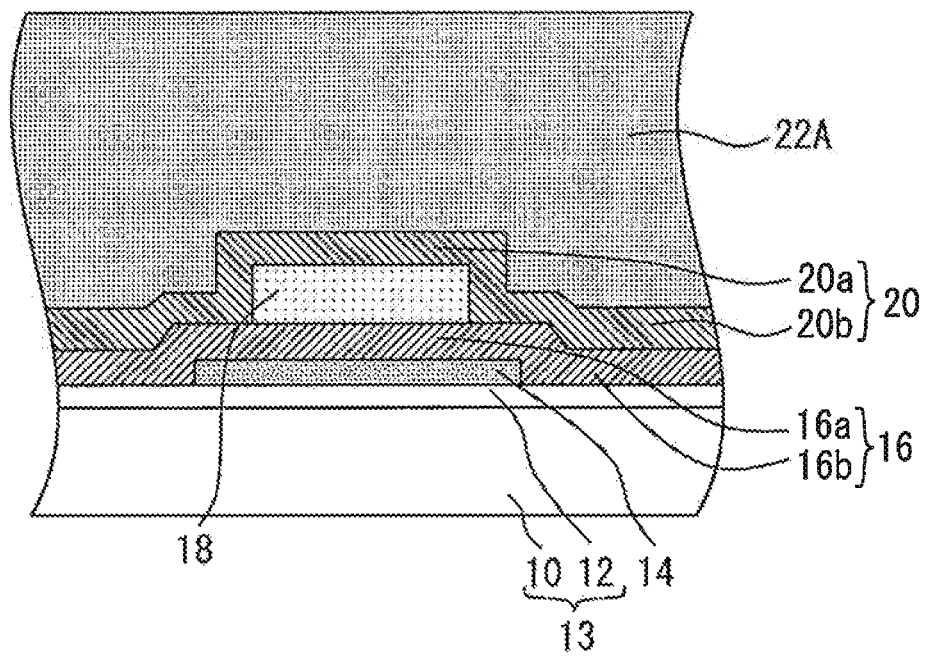
FIG. 2 is a cross-sectional view of a partially completed semiconductor device after the reinforcing film has been formed on the entire surface of the second dielectric film.

Next, a reinforcing film 22A is formed on the second dielectric film 20. FIG. 2 is a cross-sectional view of a partially completed semiconductor device after the reinforcing film 22A has been formed on the entire surface of the second dielectric film 20. The reinforcing film 22A is formed of a photosensitive material. Examples of such materials include organic resins, such as BCB and polyimide, fluoro resin, PAE, HSQ, and MSQ. The surface of the reinforcing film 22A is flat, as viewed in cross-section, although the underlying second dielectric film 20 has steps in its surface, as viewed in cross-section.

Figure 3:
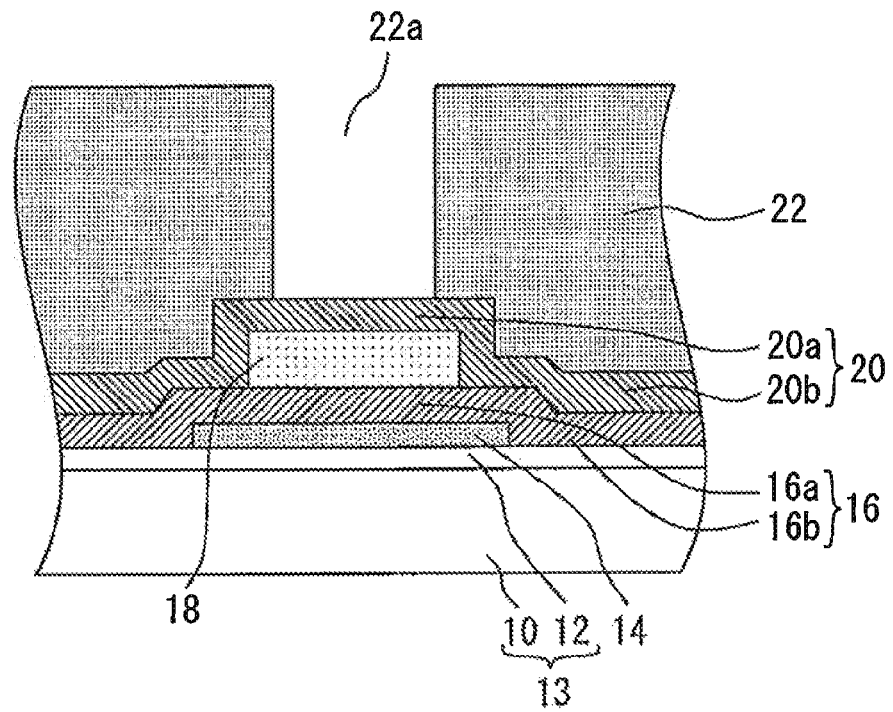
FIG. 3 is a cross-sectional view of the partially completed semiconductor device shown in FIG. 2 after the opening has been formed in the reinforcing film.
Figure 4:
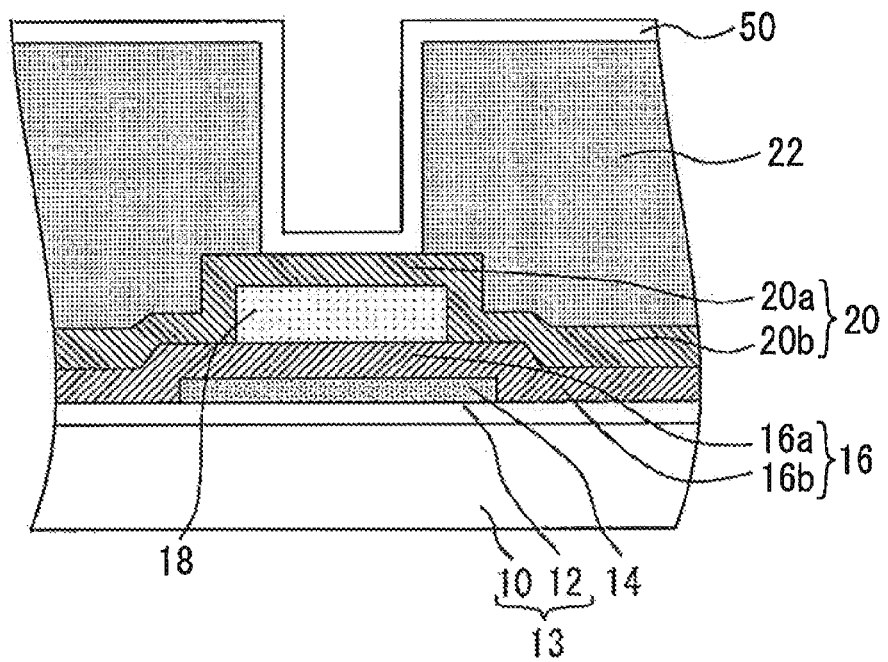
FIG. 4 is a cross-sectional view of the partially completed semiconductor device shown in FIG. 3 after the power feeding layer has been formed.

An opening 22a is then formed in the reinforcing film 22A. FIG. 3 is a cross-sectional view of the partially completed semiconductor device shown in FIG. 2 after the opening 22a has been formed in the reinforcing film 22A. Specifically, the opening 22a is formed by exposing, developing, and curing the reinforcing film 22A. The resulting reinforcing film (having the opening 22a formed therein) is referred to herein as the reinforcing film 22. A power feeding layer 50 is then formed on the exposed surfaces of the reinforcing film 22 and the second dielectric film 20. FIG. 4 is a cross-sectional view of the partially completed semiconductor device shown in FIG. 3 after the power feeding layer 50 has been formed. The power feeding layer 50 covers the top surface of the reinforcing film 22, the sidewalls of the opening 22a in the reinforcing film 22, and the surface of the third portion 20a of the second dielectric film 20 exposed by the opening 22a.

Figure 5:
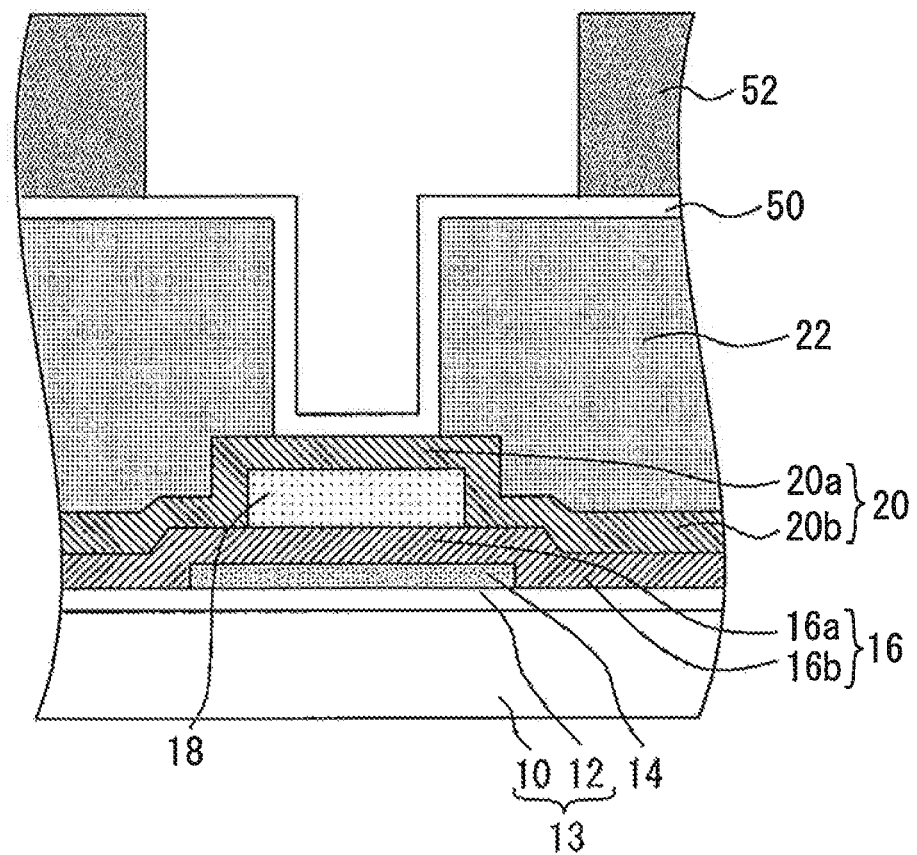
FIG. 5 is a cross-sectional view of the partially completed semiconductor device shown in FIG. 4 after the resist has been formed.
Figure 6:
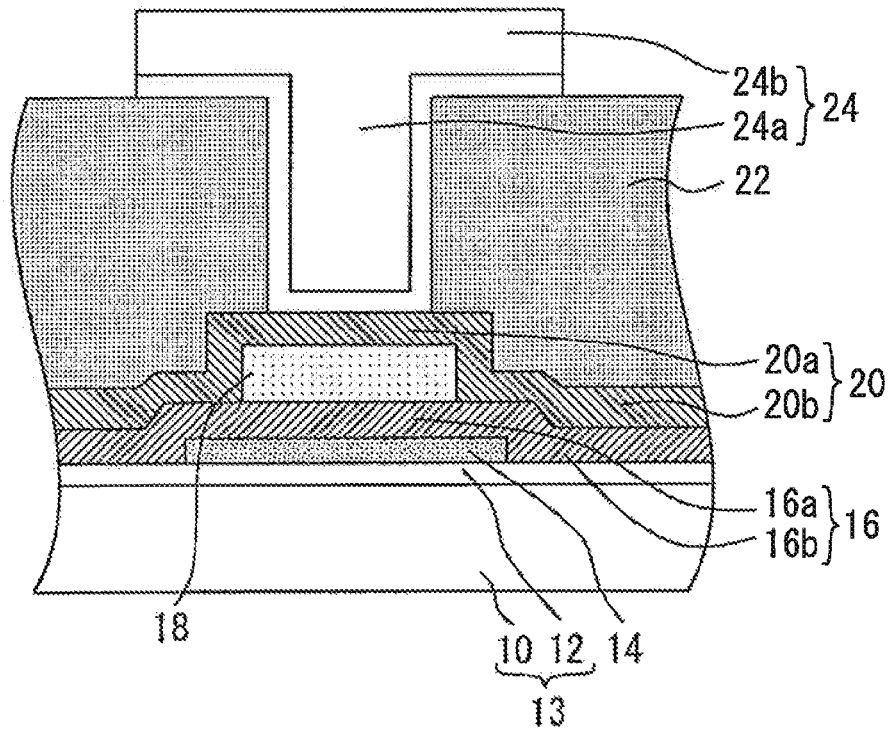
FIG. 6 is a cross-sectional view of the partially completed semiconductor device shown in FIG. 5 after the upper electrode has been formed.

Next, a resist 52 is formed on a portion of the power feeding layer 50. FIG. 5 is a cross-sectional view of the partially completed semiconductor device shown in FIG. 4 after the resist 52 has been formed. Specifically, the resist 52 is formed on the power supply layer 50 above the top surface of the reinforcing film 22. An upper electrode 24 is then formed by plating. FIG. 6 is a cross-sectional view of the partially completed semiconductor device shown in FIG. 5 after the upper electrode 24 has been formed. Subsequently, the resist 52 and the underlying portion of the power feeding layer 50 are removed. The remaining portion of the power feeding layer 50 serves as part of the upper electrode 24.

Examples of materials that may be used to form the metal layer 14, the lower electrode 18, and the upper electrode 24 include conductors containing titanium (Ti), gold (Au), platinum (Pt), aluminum (Al), copper (Cu), molybdenum (Mo), tantalum (Ta), niobium (Nb), nickel (Ni), or tungsten (W) and also include multilayer structures of these conductors. Examples of materials that may be used to form the insulating film 12, the first dielectric film 16, and the second dielectric film 20 include silicon nitride (SiN), silicon oxynitride (SiON), silicon oxide (SiO), aluminum oxide (AlO), aluminum nitride (AlN), tantalum oxide (TaO), zirconium oxide (ZrO), hafnium oxide (HfO), strontium titanate (STO), barium strontium titanate (BST) and multilayer structures thereof.

In the semiconductor device of the first embodiment, the reinforcing film 22 is in contact with sides of the upper electrode 24 and firmly secures the upper electrode 24 in place to prevent detachment or peeling of the upper electrode 24 from the second dielectric film 20. As a result, the upper electrode 24 will not detach or peel from the second dielectric film 20 even if the upper electrode 24 is subjected to substantial force, e.g., when the upper electrode 24 is spray cleaned after it is formed.

Since the reinforcing film 22 prevents detachment or peeling of the upper electrode 24, the upper electrode 24 may be formed to have a relatively small width (e.g., 4 μm). Reducing the width of the upper electrode 24 facilitates insulation of this multilayer MIM capacitor from adjacent device structures of the semiconductor device. Further, the fact that the lower electrode 18 has a relatively small width of 5 μm also facilitates insulation of this multilayer MIM capacitor from adjacent device structures of the semiconductor device. It should be noted that the adjacent device structures described above include other multilayer MIM capacitors.

In the case of a conventional MMIC having a plurality of MIM capacitors, these MIM capacitors occupy as much as approximately 20-30% of the total surface area of the MMIC. In the case of the semiconductor device of the first embodiment, which has a multilayer MIM capacitor structure, the MIM capacitors occupy a surface area which is only half the size of the surface area occupied by the MIM capacitors of a similar MMIC but having a single layer MIM capacitor structure. Thus, the configuration of the semiconductor device of the first embodiment makes it possible to reduce the size and the manufacturing cost of semiconductor devices.

Although in the semiconductor device of the first embodiment the metal layer 14 serves as the lower electrode of the lower MIM capacitor described above, it is to be understood that the metal layer 14 may be used as a wiring layer. Also in such cases, the upper MIM capacitor including the lower electrode 18 and the upper electrode 24 may be formed on the metal layer 14 (serving as a wiring layer) to achieve the same advantages as described above in connection with the first embodiment.

Although in the above example the lower electrode 18 has a width of 5 µm and the upper electrode 24 has a width of 4 µm, it is to be understood that the present embodiment is not limited to these widths. This also applies to the subsequently described embodiments. It should be noted that in order to form the entire root portion 24*a* of the upper electrode 24 on the top surface of the third portion 20*a* of the second dielectric film 20, the width of the root portion 24*a* must be less than that of the lower electrode 18.

Second Embodiment

Figure 7:
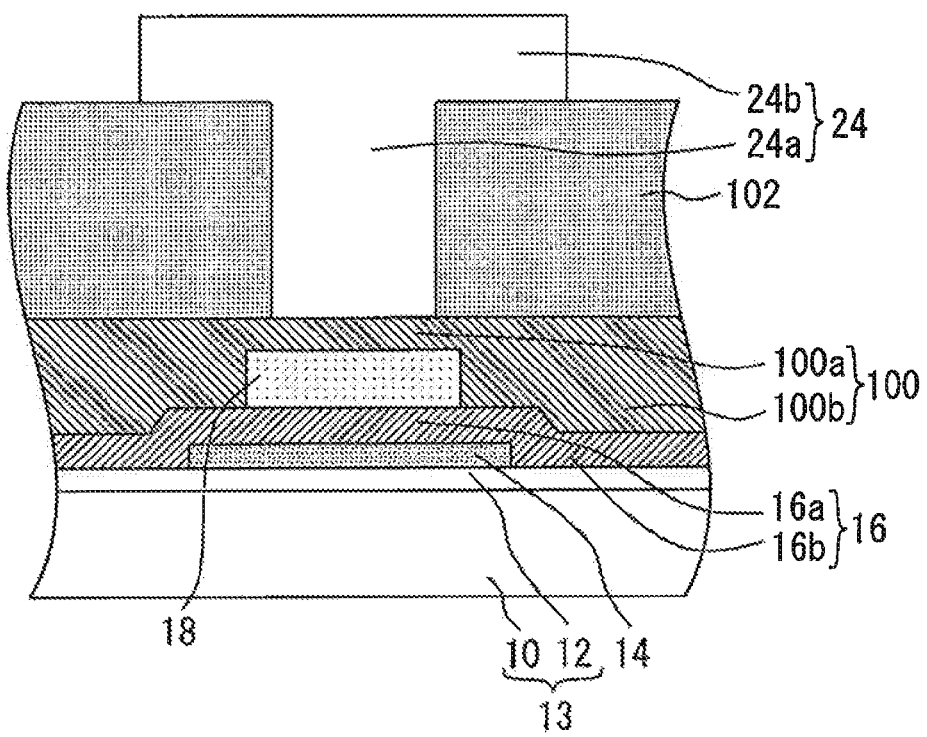
FIG. 7 is a cross-sectional view of a portion of the semiconductor device of the second embodiment.

A second embodiment of the present invention provides a semiconductor device and a method of manufacturing a semiconductor device which have many features common to the semiconductor device and the method of manufacturing a semiconductor device in accordance with the first embodiment. Therefore, the following description of the second embodiment will be primarily limited to the differences from the first embodiment. FIG. 7 is a cross-sectional view of a portion of the semiconductor device of the second embodiment. The semiconductor device of the second embodiment includes a second dielectric film 100 instead of the second dielectric film 20, and the surface of this second dielectric film 100 is flat. That is, a fourth portion 100*b* of the second dielectric film 100 (which corresponds to the fourth portion 20*b* of the second dielectric film 20) is formed to have a greater thickness than a third portion 100*a* of the second dielectric film 100 (which corresponds to the third portion 20*a* of the second dielectric film 20) so that the top surface of the third portion 100*a* is level with that of the fourth portion 100*b*.

The method of manufacturing a semiconductor device in accordance with the second embodiment will now be described. After forming the lower electrode 18 described in connection with the first embodiment, a second dielectric film 100 is formed which has a third portion 100*a* on the lower electrode 18 and a fourth portion 100*b* on the first dielectric film 16, wherein these third and fourth portions 100*a* and 100*b* are integral with each other and their top surfaces are flat and level with each other. Next, a reinforcing film 102 is formed on the second dielectric film 100 by CVD, sputtering, or vapor deposition. An opening is then formed in the reinforcing film 102 directly above the lower electrode 18, as in the first embodiment. Subsequently, an upper electrode 24 is formed to fill the opening The second dielectric film 20 formed by the semiconductor device manufacturing method of the first embodiment has steps. Therefore, the reinforcing film 22 disposed on the second dielectric film 20 is preferably formed by coating, since the surface of the reinforcing film 22 must be flat. On the other hand, the reinforcing film 100 formed by the semiconductor device manufacturing method of the second embodiment has a flat surface. Therefore, the reinforcing film 102 disposed on the second dielectric film 100 may be formed by CVD, sputtering, or vapor deposition, instead of coating.

Third Embodiment

Figure 8:
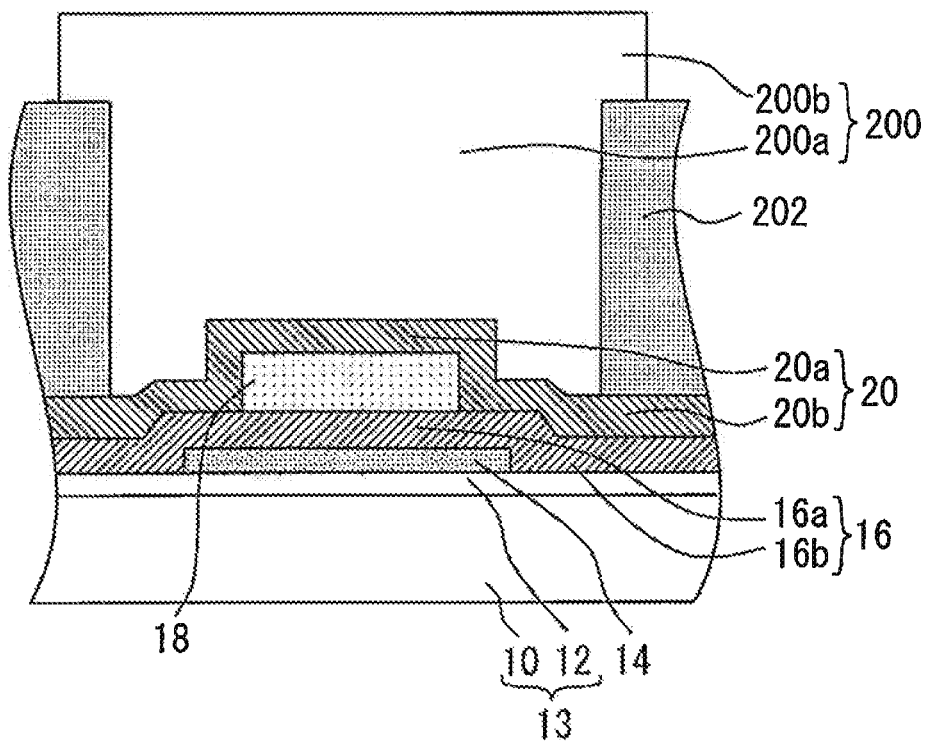
FIG. 8 is a cross-sectional view of a portion of the semiconductor device of the third embodiment.

A third embodiment of the present invention provides a semiconductor device and a method of manufacturing a semiconductor device which have many features common to the semiconductor device and the method of manufacturing a semiconductor device in accordance with the first embodiment. Therefore, the following description of the third embodiment will be primarily limited to the differences from the first embodiment. FIG. 8 is a cross-sectional view of a portion of the semiconductor device of the third embodiment. In this semiconductor device, steps are formed at the junction between the third portion 20*a* and the fourth portion 20*b* of the second dielectric film 20, as viewed in cross-section. An upper electrode 200 continuously covers the third portion 20*a* and the fourth portion 20*b* so as to cover the lower electrode 18, with the second dielectric film 20 therebetween. It should be noted that the upper electrode 200 has a root portion 200*a* and a flange portion 200*b*.

A reinforcing film 202 is formed on the fourth portion 20*b*. As shown in FIG. 8, the reinforcing film 202 has an opening wider than the opening of the reinforcing film 22 of the first embodiment. Therefore, the upper electrode 200 need not be formed by plating, but rather may be formed by, e.g., sputtering or vapor deposition.

In the case of the semiconductor device of the third embodiment, although the upper electrode 200 is formed on the steps of the second dielectric film 20, the reinforcing film 202 serves to reinforce and firmly secure the upper electrode 200 in place, thereby preventing detachment or peeling of the upper electrode 200 from the second dielectric film 20. It should be noted that the upper MIM capacitor has increased capacitance due to the increased width of the upper electrode 200, as compared to the first embodiment.

Fourth Embodiment

Figure 9:
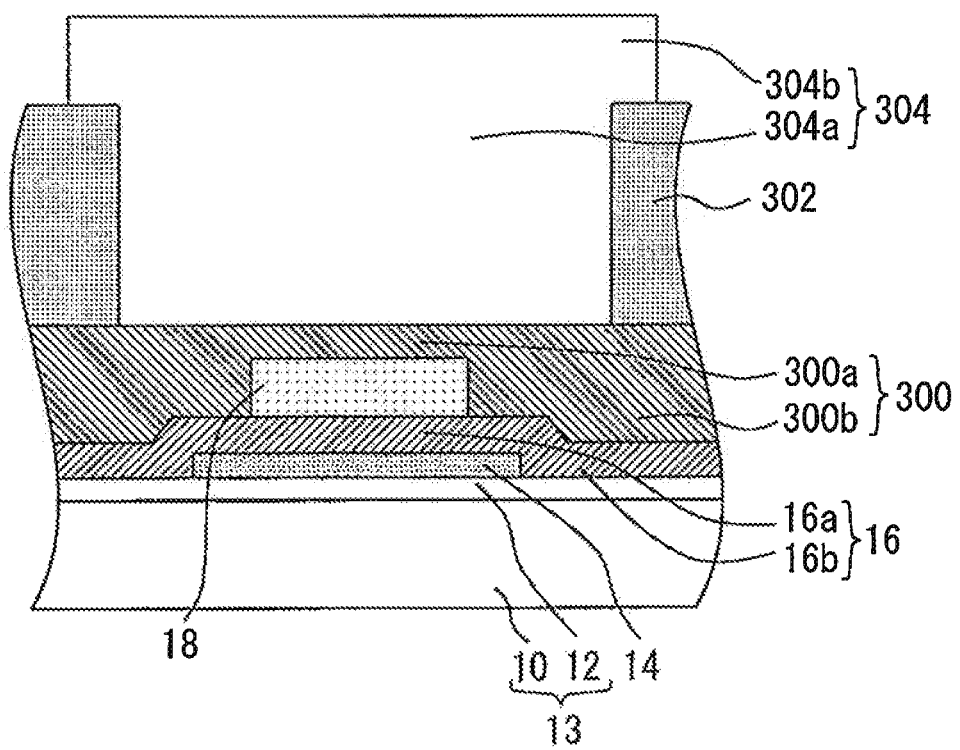
FIG. 9 is a cross-sectional view of a portion of the semiconductor device of the fourth embodiment.

A fourth embodiment of the present invention provides a semiconductor device and a method of manufacturing a semiconductor device which have many features common to the semiconductor device and the method of manufacturing a semiconductor device in accordance with the third embodiment. Therefore, the following description of the fourth embodiment will be primarily limited to the differences from the third embodiment. FIG. 9 is a cross-sectional view of a portion of the semiconductor device of the fourth embodiment. The semiconductor device of the fourth embodiment includes a second dielectric film 300 instead of the second dielectric film 20 of the third embodiment, and this second dielectric film 300 has a third portion 300*a* and a fourth portion 300*b*. The surface of the third portion 300*a* is level with that of the fourth portion 300*b*; that is, the entire top surface of the second dielectric film 300 is flat. A reinforcing film 302 is formed on the fourth portion 300*b*. An upper electrode 304 is formed on the second dielectric film 300 and the reinforcing film 302 by plating, sputtering, or vapor deposition.

Although the upper electrode 304 has a large width, the entire bottom portion (or root portion) of the upper electrode 304 is formed on the flat top surface of the second dielectric film 300; unlike the upper electrode 200 of the third embodiment, the upper electrode 304 need not be formed over steps. The upper electrode 304 is unlikely to detach or peel from the second dielectric film 300, since the upper electrode 304 is not formed over steps and furthermore is reinforced and firmly secured in place by the reinforcing film 302.

It should be noted that the semiconductor devices of the first to fourth embodiments have the common feature that the upper electrode of an upper MIM capacitor is formed on a portion of the second dielectric film of the capacitor and is reinforced and firmly secured in place by a reinforcing film.

Thus the present invention provides a semiconductor device having upper MIM capacitors formed on wiring layers or other MIM capacitors thereof wherein the upper electrode of each upper MIM capacitor is prevented from detaching or peeling from the dielectric film of the upper MIM capacitor.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-020558, filed on Feb. 5, 2013, including specification, claims, drawings, and summary, on which the Convention priority of the present application is based, is incorporated herein by reference in its entirety.

What is claimed is:

1. A semiconductor device comprising:
   a substrate;
   a metal film on a portion of said substrate;
   a first dielectric film having a first portion on said metal film and a second portion on said substrate, said second portion being integral with said first portion;
   a lower electrode on said first portion;
   a second dielectric film having a first portion on said lower electrode and a second portion on said first dielectric film, said second portion of said second dielectric film being integral with said first portion of said second dielectric film;
   an upper electrode on a portion of said second dielectric film; and
   a reinforcing film disposed on said second dielectric film and in contact with a side of said upper electrode.

2. The semiconductor device according to claim 1, wherein said metal film, said first dielectric film, and said lower electrode form a lower MIM capacitor, and said lower electrode, said second dielectric film, and said upper electrode form an upper MIM capacitor.

3. The semiconductor device according to claim 1, including a step located at a junction between said second portion of said second dielectric film and said first portion of said second dielectric film, as viewed in cross-section, wherein
   said upper electrode is on said first portion of said second dielectric film, and
   said reinforcing film continuously covers said first portion of said second dielectric film and said second portion of said second dielectric film.

4. The semiconductor device according to claim 1, including a step located at a junction between said second portion of said second dielectric film and said first portion of said second dielectric film, as viewed in cross-section, wherein
   said upper electrode continuously covers said first portion of said second dielectric film and said second portion of said second dielectric film, thereby covering said lower electrode, with said second dielectric film between said lower electrode and said upper electrode, and
   said reinforcing film is on said second portion of said second dielectric film.

5. The semiconductor device according to claim 1, wherein said upper electrode has a flange portion on said reinforcing film.

6. The semiconductor device according to claim 1, wherein said lower electrode has a width not exceeding 5 µm.

7. The semiconductor device according to claim 1, wherein said second portion of said second dielectric film is thicker than said first portion of said second dielectric film so that a top surface of said first portion of said second dielectric film is level with a top surface of said second portion of said second dielectric film.

8. The semiconductor device according to claim 1, wherein said reinforcing film is a material selected from the group consisting of benzocyclobutene (BCB), polyimide, fluoro resin, poly arylene ether (PAE), hydrogen silsequioxane (HSQ), and methyl silsequioxane (MSQ).

* * * * *